United States Patent [19]

Yamazaki

[11] Patent Number: 5,138,401
[45] Date of Patent: Aug. 11, 1992

[54] ELECTRONIC DEVICES UTILIZING SUPERCONDUCTING MATERIALS

[75] Inventor: Shunpei Yamazaki, Kanagawa, Japan

[73] Assignee: Semiconductor Energy Laboratory Co., Ltd., Kanagawa, Japan

[21] Appl. No.: 780,441

[22] Filed: Oct. 17, 1991

Related U.S. Application Data

[63] Continuation of Ser. No. 545,149, Jun. 27, 1990, abandoned, which is a continuation of Ser. No. 234,140, Aug. 9, 1988, abandoned.

[30] Foreign Application Priority Data

Aug. 24, 1987 [JP]  Japan ................................ 62-210862
Aug. 24, 1987 [JP]  Japan ................................ 62-210863

[51] Int. Cl.$^5$ .................... H01L 39/22; H01L 49/02; H01L 27/01; H01L 23/48
[52] U.S. Cl. .......................................... 357/5; 357/6; 357/23.1; 357/65; 505/1
[58] Field of Search .................. 357/5, 6, 23.1, 65; 305/1

[56] References Cited

U.S. PATENT DOCUMENTS

| | | | |
|---|---|---|---|
| 4,403,239 | 9/1983 | Yamazahi | 357/6 |
| 4,589,001 | 5/1986 | Sahai et al. | 357/5 |
| 4,816,879 | 3/1989 | Ellwanger | 357/15 |

FOREIGN PATENT DOCUMENTS

| | | | |
|---|---|---|---|
| 57-206286 | 12/1980 | Japan | 357/5 |
| 59-52885 | 3/1984 | Japan | 357/5 |
| 61-171179 | 8/1986 | Japan | 357/5 |
| 61-206279 | 12/1986 | Japan | 357/5 |
| 62-199070 | 9/1987 | Japan | 357/5 |
| 62-213179 | 9/1987 | Japan | 357/5 |
| 62-122287 | 12/1987 | Japan | 357/5 |
| 63-31181 | 2/1988 | Japan | 357/5 |

OTHER PUBLICATIONS

"Ternary Semiconductor Superconducting Device" *IBM Technical Disclosure Bulletin*, vol. 29 (Mar. 1987) pp. 4534–4536.

"Cryogenic Tunneling Transistor" *IBM Technical Disclosure Bulletin*, vol. 29 (Oct. 1986) pp. 2244–2245.

K. Beehgaard et al., "Organic Superconductors", *Scientific American* (Jul. 1982) pp. 52–62.

*Primary Examiner*—J. Carroll
*Attorney, Agent, or Firm*—Sixbey, Friedman, Leedom & Ferguson

[57] ABSTRACT

A new type superconducting electronic device is described. In the description, a field effect semiconductor device is constructed in accordance with the present invention. A superconducting ceramic material is deposited on the source and drain regions of the semiconductor device with insulating film therebetween functioning as a tunnel current film.

20 Claims, 2 Drawing Sheets

ELECTRONIC DEVICES UTILIZING SUPERCONDUCTING MATERIALS

This application is a continuation of Ser. No. 07/545,149, filed Jun. 27, 1990, abandoned which itself was a continuation of Ser. No. 07/234,140 filed Aug. 19, 1988, abandoned.

BACKGROUND OF THE INVENTION

This invention relates to an electronic device utilizing a superconducting material.

Attempts to construct solid electronic devices utilizing superconducting materials such as Nb-Ge series metallic compounds have been made so far. A representative example is the Josephson device which can operate on the basis of tunnel effects in superconducting state. This superconducting device is a two-terminal switching device.

However, since the Josephson device is a two-terminal device, input signals and output signals can not be treated independently and, therefore, no amplifying function is available. Because of this, while the superconducting device can operate at very high frequencies, the device designing is very complicated. Furthermore, there is another shortcoming in that it is inconvenient and difficult to apply for this device the conventional designing procedure which has been highly developed in semiconductor industries.

Furthermore, in case of application of ceramic superconductors to semiconductor integrated circuits, silicon semiconductor surfaces contacting ceramic superconductors tend to be oxidized after long use thereof. This oxidation makes nonconductive the interface between the semiconductor and the superconductor, so that current can not pass therethrough.

SUMMARY OF THE INVENTION

It is therefore an object of the invention to provide a superconducting device based on a new operational concept.

It is another object of the present invention is to provide a superconducting device having excellent frequency characteristics.

It is a further object of the present invention is to provide a new junction between a superconductor and a semiconductor surface.

In order to accomplish the above and other objects of the present invention, a surface portion of the semiconductor region of a superconducting device is coupled with a superconducting film with an insulating film therebetween. The insulating film functions to allow tunnel current thereacross between the superconducting film and the semiconductor region, and to protect the underlying semiconductor region from being degraded due to the influence of the overlying superconducting film or the fabricating process thereof. For this purpose, the insulating film is formed of an insulating or semi-insulating film whose thickness and energy gap are selected so as to allow tunnel currents.

DETAILED DESCRIPTION OF THE PREFERRED EMBODIMENTS

Figure 1A:
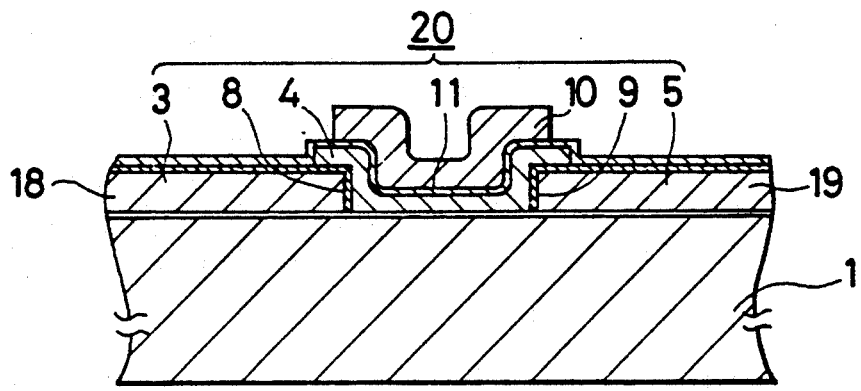
FIGS. 1(A) to 1(C) are cross sectional views showing embodiments of superconducting devices in accordance with the present invention.
Figure 1B:
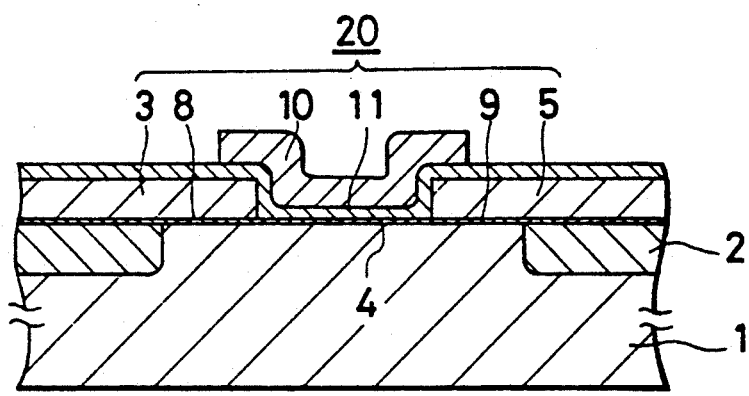
Figure 1C:
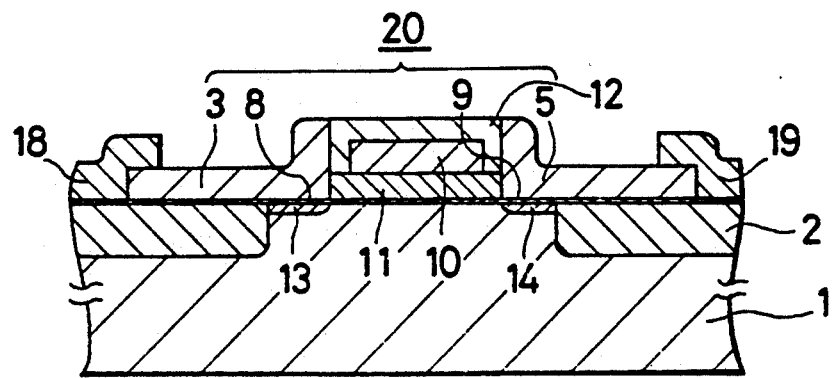

Referring to FIGS. 1(A) to 1(C), insulated gate field effect transistors in accordance with the present invention are illustrated.

The device as illustrated in FIG. 1(A) is a first embodiment in accordance with the present invention. Superconducting ceramic films 3 and 5 are deposited on an insulating substrate 1 of YSZ (yttria stabilized zircon) or strontium titanate by screen press printing, sputtering, MBE (molecular beam epitaxial growth), CVD or the like. The ceramic material conforms to, for example, $YBa_2Cu_3O_{6-8}$, $YBaSrCu_3O_{6-8}$ or $YBaCaCu_3O_{6-8}$. Other examples will be seen in the last portion of this description. When Ge, Sn, Pb, Sb, F and/or the like is added to these compositions, the height of barriers occuring at interfaces among crystals can be lowered. Simultaneously or thereafter, the structure is subjected to thermal annealing at 500° C.-1200° C. for 5 hours-10 hours, followed by gradually cooling.

After the formation of an insulating film over the ceramic films 3 and 5 and the intervening surface of the insulating substrate 1 between the films 3 and 5, a non-single-crystalline semiconductor film 4 such as an amorphous or microcrystalline silicon semiconductor film is formed on the structure straddling the intervening surface of the insulating substrate 1 by photo-CVD or plasma-CVD. The upper surface of the structure is insulated by a nonconductive film 11. A control electrode 10 is formed from a superconducting ceramic same as that described above, or a metallic material such as copper or a compound between copper and nickel by vapor evaporation. Although not illustrated, the superconducting films 18 and 19 make contact with superconducting leads at the ends 18 and 19 without contact resistance.

The operation of the device will be explained referring to FIGS. 2(A) to 2(C). The lateral direction of the diagrams corresponds to the lateral direction of FIG. 1(A) while the vertical direction is related to the energy level (potential).

Figure 2A:
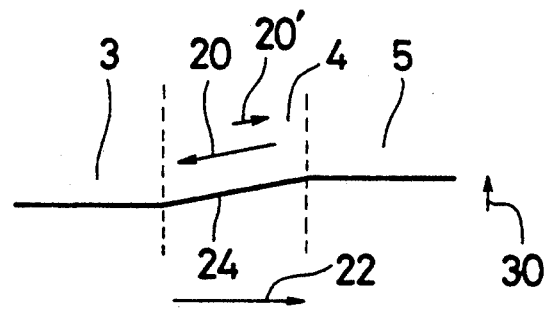
FIGS. 2(A) to 2(C) are explanational views showing the operation of a superconducting device in accordance with the present invention.
Figure 2B:
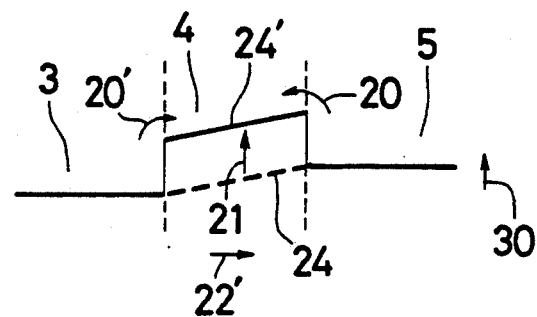
Figure 2C:
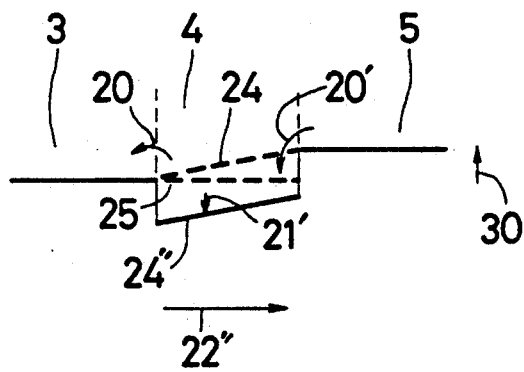

Throughout FIGS. 2(A) to 2(C), the device is given a voltage at the superconducting films 3 and 5 across the semiconductor film 4. In FIG. 2(A) is depicted the energy state for the case where no voltage is applied to the control film 10. The potential level of the film 5 becomes higher than that of the film 3 by the differential 30. By virtue of the differential potential 30, the electron flow 20 exceeds the electron flow 20' and, as a result, a current 22 is observed. In FIG. 2(B) is depicted the energy state for the case where a negative voltage is applied to the control film 10. By virtue of the potential barrier established at the active semiconductor film 4, the electron flow 20' and the electron flow 20 are suppressed. Eventually, the limited current 22' is observed. In FIG. 2(C) is depicted the energy state for the case where a positive voltage is applied to the control film 10. By virtue of the depressed potential corresponding to the film 4, the electron flow 20' is enhanced while the electron flow 20 is suppressed. However, once the potential depression is filled with electrons, the potential line 24" is shifted to a potential line 25 (broken line). As a result, a current 22" comparable to the current 22 in FIG. 2(A) can flow therethrough.

Figure 3:
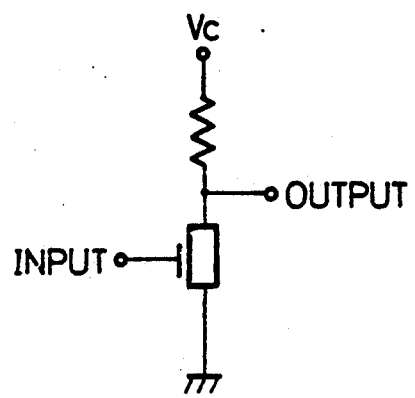
FIG. 3(A) is a circuit diagram showing an application of a superconducting device in accordance with the present invention.

As explained above, an output current passing through the semiconductor film 4 can be controlled in accordance with the input voltage applied to the control electrode 10. If the insulating film underlying the control electrode provides a sufficient isolation, the output energy can be larger than the input energy, and therefore amplification can be performed. Also, when arranged in a circuit illustrated in FIG. 3, the superconducting device functions as an invertor.

FIG. 1(B) is a cross sectional view showing a second embodiment in accordance with the present invention. Field insulating regions 2 are formed within a silicon semiconductor substrate 1, an active region 4 being situated between the regions 2. Superconducting films 3 and 5 are formed on the substrate surface at both sides of the active region 4 through an insulating film 8 and 9 provided for tunnel current. An insulating film 11 of silicon oxide is formed on the structure. A control electrode 10 is formed above the active region and the distal end portions of the superconducting films 3 and 5.

The insulating film for tunnel current is formed by heating the silicon substrate in a highly pure ammonia atmosphere at 700°–950° C. for 15–40 minutes in order to produce a silicon nitride film of 10–25 Å thickness on the surface of the substrate 1. Other examples of materials forming insulating films are, silicon carbide and materials mainly comprising carbon such as diamond-like carbon. The formation process of carbon materials can be seen in U.S. patent application Ser. No. 159,857 filed on Feb. 24, 1988. The energy gaps of silicon oxide, silicon nitride and diamond-like carbon are 8eV, 5eV, 3eV and 1-5 eV respectively.

FIG. 1(C) shows a third embodiment in accordance with the present invention. Field insulating regions 2 are formed within a silicon semiconductor substrate in the same manner as the preceding embodiment. Between the insulating regions 2, an insulating film 11 is formed from a thermal oxidation film. Further, a control film 10 is formed from a superconducting ceramic, a silicon semiconductor or a metal oxide, followed by patterning the control film and the underlying insulating film 11.

Next, with the control film and/or the photo-resist remaining thereon as the mask, a p-type or n-type impurity is introduced into the semiconductor substrate by ion implantation in order to produce impurity regions 13 and 14 within the substrate. The impurity regions function as source and drain regions for IGFET. Insulating films 8 and 9 of a semi-insulating silicon carbide film of 10–30 Å thickness is formed by heating the substrate in an atmosphere of a highly pure methane at 800°–1050° C. In this procedure, the doped semiconductor regions are annealed simultaneously to have an impurity density of $1 \times 10^{19}$ to $1 \times 10^{21}$ cm$^{-3}$. A superconducting oxide is deposited on the structure by sputtering or electron beam evaporation, and patterned in the same manner as in the foregoing embodiments to form superconducting films 3 and 5. The superconducting films 3 and 5 cover most of the surface portions of the impurity regions 13 and 14. Further, superconducting or non-superconducting leads may be formed in contact with the superconducting films 3 and 5 for connection with external circuits, if desired. Reference numeral 12 designates an overlying insulating film.

As a modification, multi-layered superconducting structure can be designed by covering the upper surface of the superconducting film with an insulating film, forming an opening in the insulating film, and depositing another superconducting film on the insulating film in order to make contact with the lower superconducting film through the opening.

The lengths of the active regions of the semiconductor substrates in accordance with the present invention are chosen to be 1 micron or less, so that the devices can be operated at frequencies not lower than 1 nano second.

Superconducting ceramics for use in accordance with the present invention also may be prepared in consistence with the stoichiometric formulae $(A_{1-x}B_x)_y Cu_z O_w X_v$, where A is one or more elements of Group IIIa of the Periodic Table, e.g., the rare earth elements, B is one or more elements of Group IIa of the Periodic Table, e.g., the alkaline earth metals including beryllium and magnesium, X is one or more elements of a group consisting of Ge, Sn, Pb, F and Cl, and x=0–1; y=2-.0–4.0, preferably 2.5–3.5; z=1.0–4.0, preferably 1.5–3.5; w=4.0–10.0, preferably 6.0–8.0; and v=0–3. Also, superconducting ceramics for use in accordance with the present invention may be prepared consistent with the stoichiometric formulae $(A_{1-x}B_x)_y Cu_z O_w$, where A is one or more elements of Group Vb of the Periodic Table, such as Bi, Sb and As, B is one or more elements of Group IIa of the Periodic Table, e.g., the alkaline earth metals including beryllium and magnesium, and x=0.3–1; y=2.0–4.0, preferably 2.5–3.5; z=1.0–4.0, preferably 1.5–3.5; and w=4.0–10.0, preferably 6.0–8.0. Examples of this general formula are $BiSrCaCuCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40°–60° K., which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$. The number x denoting the oxygen proportion is 6–10, e.g. around 8.1. Such superconducting materials can be formed by screen press printing, vacuum evaporation or CVD.

Also, organic superconducting materials which has received a great deal of attention can be used for embodying the present invention.

While a description has been made for several embodiments, the present invention should be limited only by the appended claims and should not be limited by the particular examples. For example, the present invention can be applied for MIS FETs, bipolar semicondutor devices, VLSIs or USLIs.

I claim:

1. In a superconducting device comprising a semiconductor region and a superconducting region electrically connected to said semiconductor region, the improvement comprising a barrier layer formed at an interface between said semiconductor region and said superconducting region, which barrier layer is such that tunneling currents can be passed therethrough.

2. The superconducting device of claim 1 wherein said barrier layer comprises a non-oxide material.

3. The superconducting device of claim 2 wherein said non-oxide material is selected from the group consisting of silicon nitride, silicon carbide and diamond-like carbon.

4. The superconducting device of claim 1 wherein said barrier layer has a thickness from 10 to 30 Angstroms.

5. The device of claim 1 wherein said superconducting regions comprise a superconducting material represented by a general formula:

$$(A_{1-x}B_x)_y Cu_z O_w X_v$$

where A is one or more elements selected from the group consisting of Sc, Y, Lanthanides and Actinides, B is one or more elements selected from the group consisting of Be, Mg, Ca, Sr, Ba and Ra, X is one or more elements selected from the group consisting of Ge, Sn, Pb, F and Cl and where $x=0-1$; $y=2-4$; $z=1-4$; $w=4-10$; and $v=0-3$.

6. The device of claim 1 wherein said superconducting regions comprise a superconducting material represented by a general formula:

$$(A_{1-x}B_x)_y Cu_z O_w$$

where A is one or more elements selected from the group consisting of N, P, As, Sb and Bi, B is one or more elements selected from the group consisting of Be, Mg, Ca, Sr, Ba and Ra, where $x=0.3-1$; $y=2-4$; $z=1-4$; and $w=4-10$.

7. A superconducting device comprising:
a pair of oxide superconducting regions;
a semiconductor region formed between said pair of superconducting regions;
barrier layers formed at interfaces between said semiconductor region and said superconducting regions for preventing an interaction with each other;
a control electrode formed on said semiconductor region for applying an electric field thereto with an insulating layer therebetween;
wherein said barrier layers are such that tunneling currents can be passed therethrough.

8. The device of claim 7 wherein said barrier layers have a thickness from 10 to 30 Angstroms.

9. The device of claim 7 wherein the barrier layers are insulating layers or semi-insulating layers.

10. The device of claim 7 wherein said superconducting regions comprise a superconducting material represented by a general formula:

$$(A_{1-x}B_x)_y Cu_z O_w X_v$$

where A is one or more elements selected from the group consisting of Sc, Y, Lanthanides and Actinides, B is one or more elements selected from the group consisting of Be, Mg, Ca, Sr, Ba and Ra, X is one or more elements selected from the group consisting of Ge, Sn, Pb, F and Cl and where $x=0-1$; $y=2-4$; $z=1-4$; $w=4-10$; and $v=0-3$.

11. The device of claim 7 wherein said superconducting regions comprise a superconducting material represented by a general formula:

$$(A_{1-x}B_x)_y Cu_z O_w$$

where A is one or more elements selected from the group consisting of N, P, As, Sb and Bi, B is one or more elements selected from the group consisting of Be, Mg, Ca, Sr, Ba and Ra, where $x=0.3-1$; $y=2-4$; $z=1-4$; and $w=4-10$.

12. A superconducting device comprising:
a pair of oxide superconducting regions;
a semiconductor region formed between said pair of superconducting regions;
barrier layers formed at interfaces between said semiconductor region and said superconducting regions for preventing an interaction with each other;
a control electrode formed on said semiconductor region for applying an electric field thereto with an insulating layer therebetween;
wherein said barrier layers are such that tunneling currents can be passed therethrough and comprise a non-oxide material.

13. The device of claim 12 wherein said barrier layers have a thickness from 10 to 30 Angstroms.

14. The device of claim 12 wherein the barrier layers are insulating layers or semi-insulating layers.

15. The device of claim 12 wherein said superconducting regions comprise a superconducting material represented by a general formula:

$$(A_{1-x}B_x)_y Cu_z O_w X_v$$

where A is one or more elements selected from the group consisting of Sc, Y, Lanthanides and Actinides, B is one or more elements selected from the group consisting of Be, Mg, Ca, Sr, Ba and Ra, X is one or more elements selected from the group consisting of Ge, Sn, Pb, F and Cl, and where $x=0-1$; $y=2-4$; $z=1-4$; $w=4-10$; and $v=0-3$.

16. The device of claim 12 wherein said superconducting regions comprise a superconducting material represented by a general formula:

$$(A_{1-x}B_x)_y Cu_z O_w$$

where A is one or more elements selected from the group consisting of N, P, As, Sb and Bi, B is one or more elements selected from the group consisting of Be, Mg, Ca, Sr, Ba and Ra, where $x=0.3-1$; $y=2-4$; $z=1-4$; and $w=4-10$.

17. A superconducting device comprising:
a pair of oxide superconducting regions;
a semiconductor region formed between said pair of superconducting regions;
barrier layers formed at interface between said semiconductor region and said superconducting regions for preventing an interaction with each other;
a control electrode formed on said semiconductor region for applying an electric field thereto with an insulating layer therebetween;
wherein said barrier layers are such that tunneling currents can be passed therethrough and comprise a material selected from the group consisting of silicon nitride, silicon carbide and diamond-like carbon.

18. The device of claim 12 wherein said barrier layers have a thickness from 10 to 30 Angstroms.

19. The device of claim 12 wherein said superconducting regions comprise a superconducting material represented by a general formula:

$$(A_{1-x}B_x)_y Cu_z O_w X_v$$

where A is one or more elements selected from the group consisting of Sc, Y, Lanthanides and Actinides, B is one or more elements selected from the group consisting of Be, Mg, Ca, Sr, Ba and Ra, X is one or more elements selected from the group consisting of Ge, Sn, Pb, F and Cl, and where $x=0-1$; $y=2-4$; $z=1-4$; $w=4-10$; and $v=0-3$.

20. The device of claim 17 wherein said superconducting regions comprise a superconducting material represented by a general formula:

$$(A_{1-x}B_x)_y Cu_z O_w$$

where A is one or more elements selected from the group consisting of N, P, As, Sb and Bi, B is one or more elements selected from the group consisting of Be, Mg, Ca, Sr, Ba and Ra, where $x = 0.3-1$; $y = 2-4$; $z = 1-4$; and $w = 4-10$.

* * * * *